United States Patent
Wu et al.

[11] Patent Number: 6,150,238
[45] Date of Patent: Nov. 21, 2000

[54] METHOD FOR FABRICATING A TRENCH ISOLATION

[75] Inventors: Chih-Ta Wu, Hsinchu; Wen-Jet Su, Tainan; Tun-Fu Hung, Kaohsiung Hsien; Ming-Ren Chi, Hualien Hsien, all of Taiwan

[73] Assignee: Mosel Vitelic, Inc., Taiwan

[21] Appl. No.: 09/313,129

[22] Filed: May 17, 1999

[30] Foreign Application Priority Data

Mar. 4, 1999 [TW] Taiwan ................................. 88103294

[51] Int. Cl.⁷ .................................................. H01L 21/762
[52] U.S. Cl. .......................... 438/435; 438/624; 438/787
[58] Field of Search ................................... 438/421, 422, 438/411, 436, 319, 359, 619, 624, 787, 435; 257/522

[56] References Cited

U.S. PATENT DOCUMENTS

| | | | |
|---|---|---|---|
| 5,691,573 | 11/1997 | Avanzino et al. | 257/758 |
| 5,837,618 | 11/1998 | Avanzino et al. | 438/778 |
| 5,861,342 | 1/1999 | Gabriel et al. | 438/631 |
| 5,960,300 | 9/1999 | Yabu et al. | 438/736 |
| 5,985,034 | 11/1999 | Park | 118/724 |
| 6,024,106 | 2/2000 | Yang et al. | 134/1.3 |
| 6,030,881 | 2/2000 | papasouliotis et al. | 438/424 |
| 6,033,981 | 3/2000 | Lee et al. | 438/624 |

*Primary Examiner*—Olik Chaudhuri
*Assistant Examiner*—Anh Duy Mai
*Attorney, Agent, or Firm*—Oppenheimer Wolff & Donnelly; Chien-Wei (Chris) Chou

[57] ABSTRACT

A method for fabricating a trench isolation is disclosed. First, a first insulated layer having a void is formed within the trench of the semiconductor. Next, the upper portion of said first insulated layer is etched to remove the void of said first insulated layer. Then, a second insulated layer having a void is formed over the first insulated layer. Next, the upper portion of said second insulated layer is etched to remove the void of said second insulated layer, thereby forming a trench isolation including the remainder of said first and second insulated layers.

14 Claims, 6 Drawing Sheets

METHOD FOR FABRICATING A TRENCH ISOLATION

BACKGROUND OF THE INVENTION

1. Field of the Invention

The present invention relates to a method for fabricating semiconductor devices, and more particularly to a method for fabricating a trench isolation without void problems.

2. Description of the Prior Art

Trench isolation (TI) has been gaining popularity for sub-micron technology and beyond to replace the traditional local oxidation of silicon (LOCOS) isolation process. However, as the design rule continues to shrink, gap filling a trench with a large aspect ratio (depth/width) has become increasingly challenging.

Referring to FIGS. 1A through 1C, the cross-sectional side views of a conventional method for fabricating a trench isolation are depicted in sequence.

Referring now to FIG. 1A, a cross-sectional view of the first step is schematically shown. FIG. 1A shows a semiconductor substrate 10 having a trench 12 that has an aspect ratio larger than 2. Preferably, a stop layer (not shown) for chemical mechanical polishing (CMP) could be formed on the semiconductor substrate 10.

Next, as shown in FIG. 1B, a oxide layer 14 having a void 16 is filled within the trench 12 by atmospheric pressure chemical vapor deposition (APCVD), using ozone and tetraethoxysilane (TEOS) as the main reactive gas. Thereafter, the oxide layer 14 is annealed for densification of the oxide layer 14.

Referring now to FIG. 1C, the oxide layer 14 is polished to leave the oxide layer 14a serving as the trench isolation.

As the aspect ratio of the trench becomes larger, the conventional APCVD method can not provide sufficient gap filling capacity. Therefore, it is necessary to form the trench isolation by high density plasma chemical vapor deposition (HPCVD). However, the cost of the apparatus will be very greatly increased.

SUMMARY OF THE INVENTION

In view of the above disadvantages, an object of the invention is to provide a new method for fabricating a trench isolation with conventional APCVD apparatus.

It is a further object of the invention to provide a method for fabricating a trench isolation that eliminates void problems.

The above objects are attained by providing a method for fabricating a trench isolation comprising the steps of: forming a first insulated layer having a void within the trench; etching the upper portion of said first insulated layer to remove the void of said first insulated layer; forming a second insulated layer having a void over the first insulated layer; and etching the upper portion of said second insulated layer to remove the void of the second insulated layer, thereby forming a trench isolation including the remainder of the first and second insulated layer.

The above objects are also attained by providing a method for fabricating a trench isolation, comprising the steps of: providing a semiconductor substrate having a trench; forming a first oxide layer having a void within the trench by chemical vapor deposition; annealing said first oxide layer to densify said first oxide layer; wet etching the upper portion of said densified first oxide layer to remove the void of said first oxide layer; forming a second oxide layer having a void over the first oxide layer by chemical vapor deposition; annealing said second oxide layer to densify said second oxide layer; wet etching the upper portion of said denseified second oxide layer to remove the void of said second oxide layer, thereby forming a trench isolation including the remainder of the first and second oxide layers.

An aspect of the invention is to provide a method of fabricating a trench isolation in which said first and second insulated layers are first and second oxide layers formed by atmospheric pressure chemical vapor deposition (APCVD).

Another aspect of the invention is repeating the APCVD and wet etching steps at least twice.

BRIEF DESCRIPTION OF THE DRAWINGS

The preferred embodiment of the invention is hereinafter described with reference to the accompanying drawings in which.

DETAILED DESCRIPTION OF THE PREFERRED EMBODIMENTS

The preferred embodiment of the invention is illustrated in FIGS. 2A through 2G of the drawings. In this embodiment, the process of this invention is performed by three repetitions of the APCVD and wet etching steps.

Figure 1A:
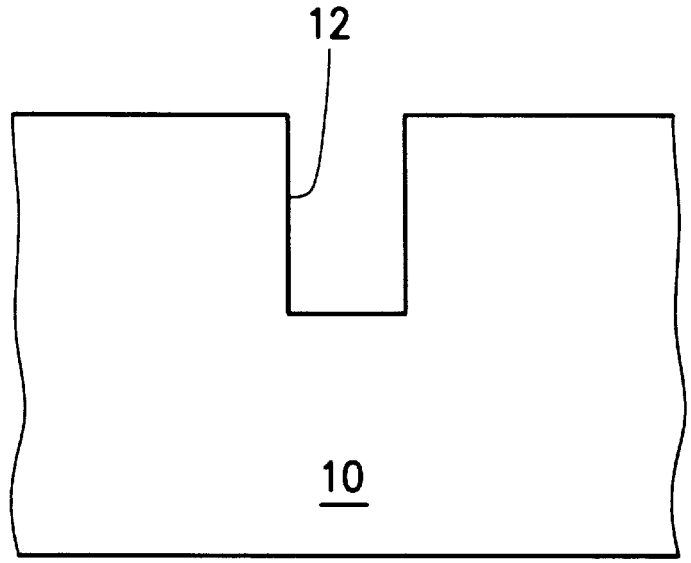
FIGS. 1A through 1C are cross-sectional side views showing the manufacturing steps of a trench isolation of the prior art.
Figure 1B:
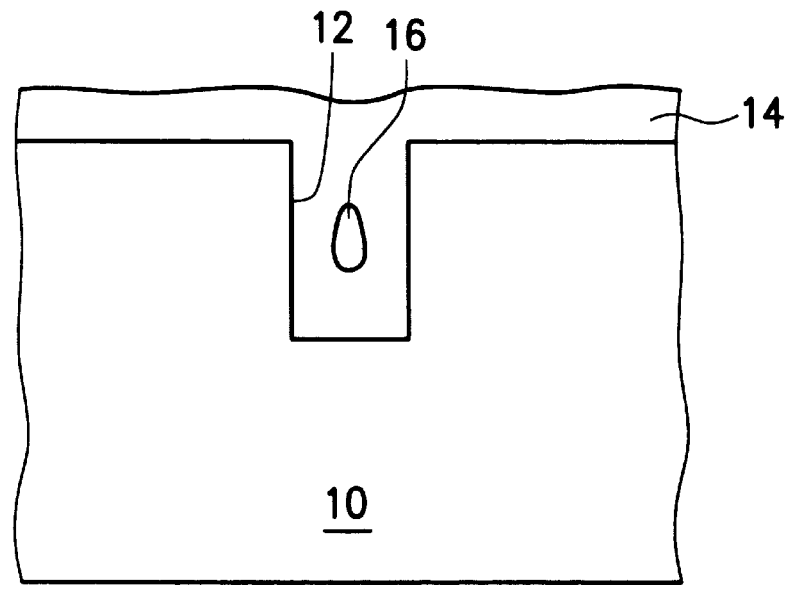
Figure 1C:
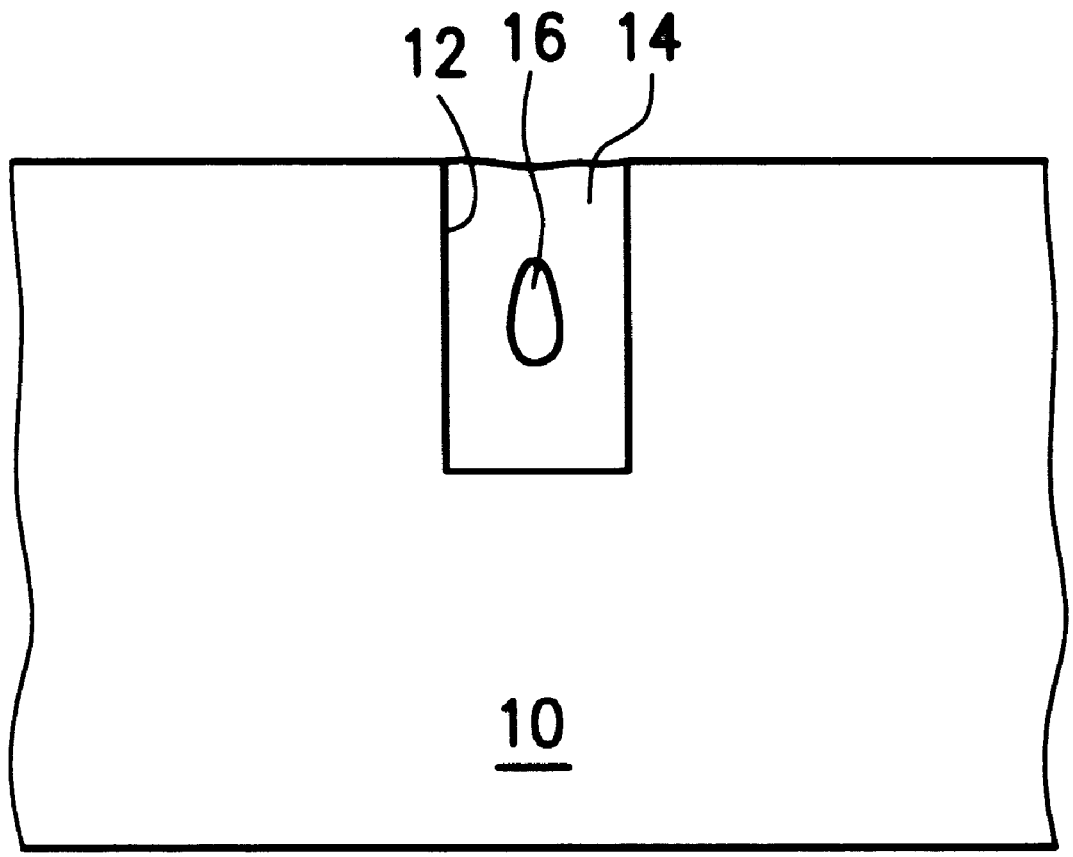
Figure 2A:
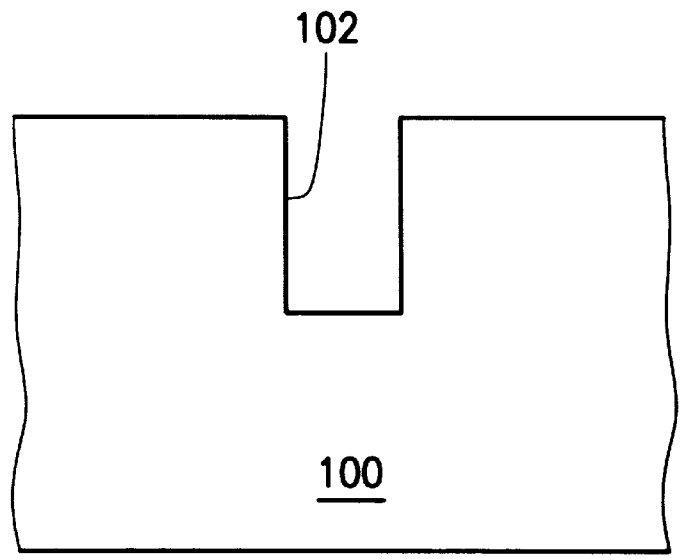
FIGS. 2A through 2G are cross-sectional side views showing the manufacturing steps of a trench isolation of the invention.

Referring now to FIG. 2A, a cross-sectional view of the first step is schematically shown. In FIG. 2A, a trench 102 is formed in a semiconductor substrate 100, such as p-type monocrystalline silicon substrate. The trench 102 is formed by anisotropically etching the semiconductor substrate 100 and has an aspect ratio larger than 2. Preferably, a stop layer (not shown) for chemical mechanical polishing (CMP) could be formed on the semiconductor substrate 100.

Figure 2B:
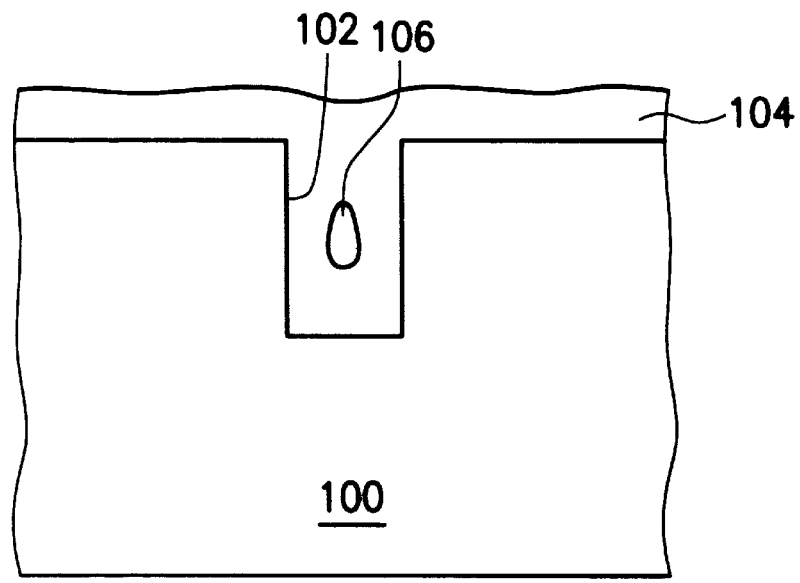

Next, as shown in FIG. 2B, a first oxide layer 104 is deposited overlaying the semiconductor substrate 100 and filled within the trench 102 by atmospheric pressure chemical vapor deposition (APCVD) using ozone and tetraethoxysilane (TEOS) as the main reactive gas. As the design rule continues to shrink, the aspect ratio of the trench 102 becomes larger; thus, the void 106 is naturally formed in the first oxide 104. Thereafter, the first oxide layer 104 is annealed at a temperature of 800 to 1000° C. for densification.

Figure 2C:
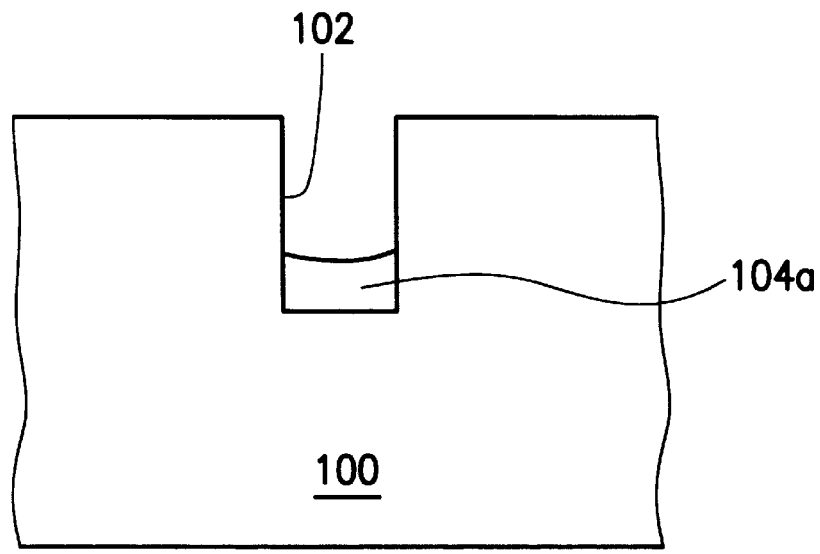

Then, as shown in FIGS. 2B and 2C, the upper portion of the first oxide layer 104 is removed by 5% hydrogen fluoride wet etching to leave a first oxide layer 104a.

Figure 2D:
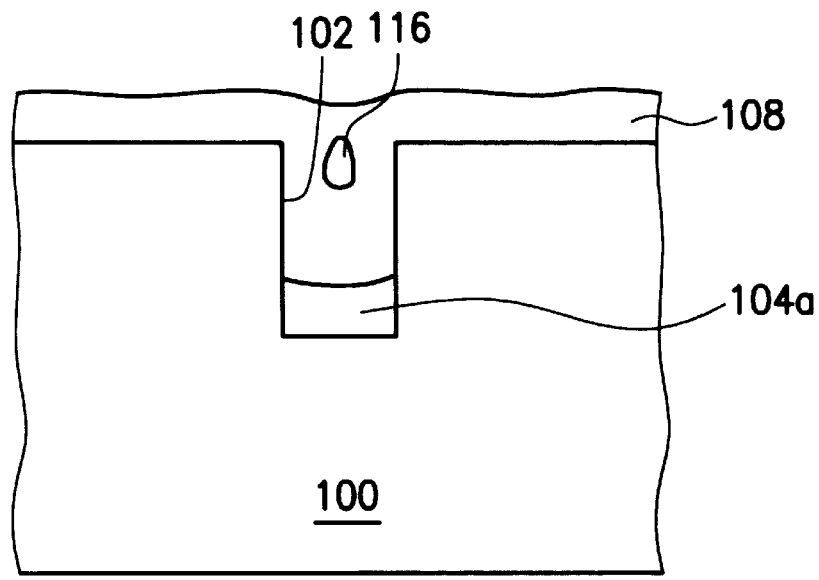

Referring now to FIG. 2D, a second oxide layer 108 having a void 110 is deposited over the semiconductor substrate 100 and filled within the trench 102 by atmospheric pressure chemical vapor deposition using ozone and tetraethoxysilane (TEOS) as the main reactive gas. Thereafter, the second oxide layer 108 is annealed at a temperature of 800 to 1000° C. for densification.

Figure 2E:
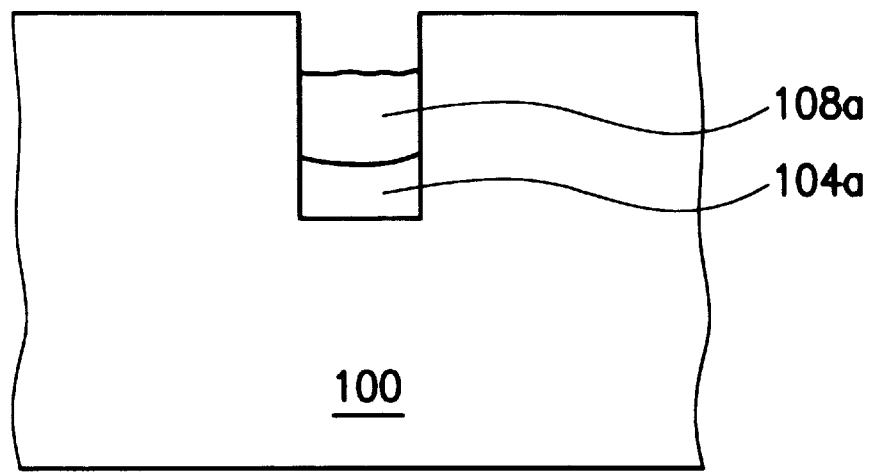

Referring now to FIGS. 2D and 2E, the upper portion of the second oxide layer 108 is removed by 5% hydrogen fluoride wet etching to leave a second oxide layer 108a.

Figure 2F:
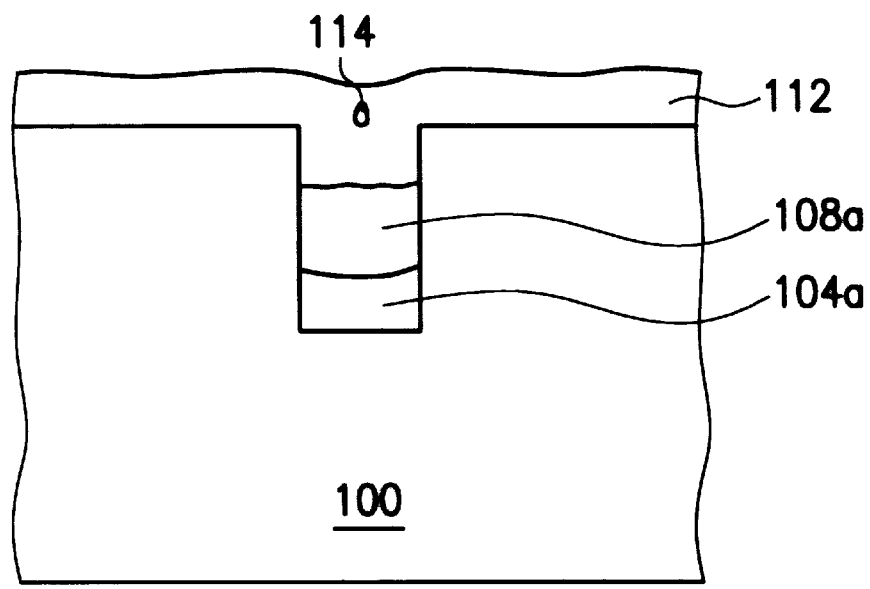

Next, as shown in FIG. 2F, a third oxide layer 112 having a void 114 is deposited over the semiconductor substrate 100 and filled within the trench 102 by atmospheric pressure chemical vapor deposition using ozone and tetraethoxysilane (TEOS) as the main reactive gas. Thereafter, the third oxide layer 112 is annealed at a temperature of 800 to 1000° C. for densification.

Figure 2G:
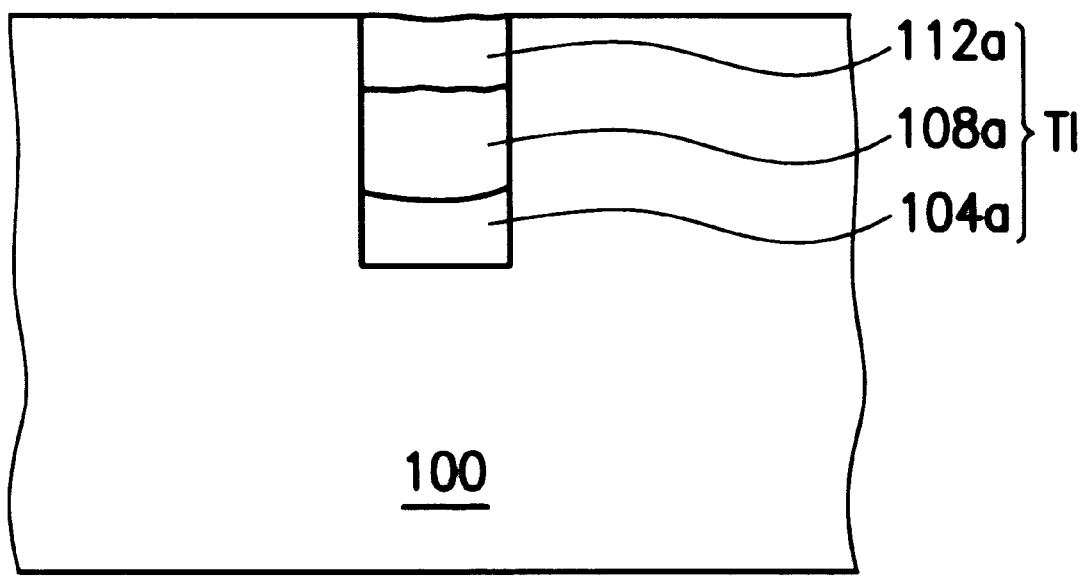

Referring now to FIGS. 2F and 2G, the upper portion of the third oxide layer 112 is removed by 5% hydrogen fluoride wet etching to leave a third oxide layer 112a. The trench isolation TI consists of the first oxide layer 104a, second oxide layer 108a, and third oxide layer 112a.

The process of this invention includes at least two repetitions of the APCVD and wet etching steps. The invention eliminates void problems caused by the current method. Furthermore, it doesn't require HDPCVD equipment. As a result, the apparatus cost can be reduced.

While the present invention has been particularly shown and described with reference to a preferred embodiment, it will be readily appreciated by those of ordinary skill in the art that various changes and modifications may be made without departing from the spirit and scope of the invention. It is intended that the claims be interpreted to cover the disclosed embodiment, those alternatives which have been discussed above and all equivalents thereto.

What is claimed is:

1. A method for fabricating a trench isolation suitable for a semiconductor substrate having a trench comprising the steps of:
   forming a first insulated layer having a void within the trench;
   etching the upper portion of said first insulated layer to remove the void of said first insulated layer;
   forming a second insulated layer having a void over said first insulated layer; and
   etching the upper portion of said second insulated layer to remove the void of the second insulated layer, thereby forming a trench isolation including the remainder of said first and second insulated layers.

2. A method for fabricating a trench isolation as claimed in claim 1, wherein said first and second insulated layers are first and second oxide layers formed by atmospheric pressure chemical vapor deposition (APCVD).

3. A method for fabricating a trench isolation as claimed in claim 2, wherein said first and second insulated layers are formed by using ozone and TEOS as the reactive gas.

4. A method for fabricating a trench isolation as claimed in claim 2, further comprising a step of annealing to densify said first and second insulated layers after the step forming said first and second insulated layers.

5. A method for fabricating a trench isolation as claimed in claim 4, wherein the annealing step is performed at the temperature of 800~1100° C.

6. A method for fabricating a trench isolation as claimed in claim 1, wherein said etching step is performed by using 5 wt % hydrogen fluoride solution.

7. A method for fabricating a trench isolation as claimed in claim 1, wherein said trench has an aspect ratio larger than 2.

8. A method for fabricating a trench isolation, comprising the steps of:
   providing a semiconductor having a trench;
   forming a first oxide layer having a void within the trench by chemical vapor deposition;
   etching the upper portion of said first oxide layer to remove the void of said first oxide layer; and
   forming a second oxide layer having a void over the first oxide layer by chemical vapor deposition;
   etching the upper portion of said second oxide layer to remove said void of the second oxide layer;
   forming a third oxide layer having a void over the second oxide layer by chemical vapor deposition; and
   etching the upper portion of said third oxide layer to remove said void of the third oxide layer, thereby forming a trench isolation including the remainder of said first, second, and third oxide layers.

9. A method for fabricating a trench isolation, comprising the steps of:
   providing a semiconductor substrate having a trench;
   forming a first oxide layer having a void within the trench by chemical vapor deposition;
   annealing said first oxide layer to densify said first oxide layer;
   wet etching the upper portion of said densified first oxide layer to remove the void of said first oxide layer;
   forming a second oxide layer having a void over the first oxide layer by chemical vapor deposition;
   annealing said second oxide layer to densify said second oxide layer;
   wet etching the upper portion of said densified second oxide layer to remove the void of said second oxide layer, thereby forming a trench isolation including the remainder of said first and second oxide layers.

10. A method for fabricating a trench isolation as claimed in claim 9, wherein said semiconductor substrate is p-type monocrystalline silicon substrate.

11. A method for fabricating a trench isolation as claimed in claim 9, wherein said first and second oxide layers are formed by using ozone and TEOS as the reactive gas.

12. A method for fabricating a trench isolation as claimed in claim 9, wherein the annealing step is performed at the temperature of 800~1100° C.

13. A method for fabricating a trench isolation as claimed in claim 9, wherein said wet etching step is performed by using 5 wt % hydrogen fluoride solution.

14. A method for fabricating a trench isolation as claimed in claim 9, wherein said trench has a aspect ratio larger than 2.

* * * * *